United States Patent
Sakakibara et al.

(10) Patent No.: US 7,613,312 B2
(45) Date of Patent: Nov. 3, 2009

(54) AUDIO PROCESSING APPARATUS FOR IMPLEMENTING LEVEL CORRECTIONS OF AUDIO DATA

(75) Inventors: Tomoko Sakakibara, Osaka (JP); Takeshi Fujita, Osaka (JP); Norio Hatanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 1040 days.

(21) Appl. No.: 10/851,181

(22) Filed: May 24, 2004

(65) Prior Publication Data

US 2004/0240685 A1 Dec. 2, 2004

(30) Foreign Application Priority Data

May 30, 2003 (JP) ............... P2003-155067

(51) Int. Cl.
*H03G 3/00* (2006.01)
*H04R 29/00* (2006.01)

(52) U.S. Cl. ................. 381/104; 381/56

(58) Field of Classification Search ........... 381/104, 381/106, 107, 94.3, 56
See application file for complete search history.

(56) References Cited

U.S. PATENT DOCUMENTS

| | | | |
|---|---|---|---|
| 5,396,562 A | * | 3/1995 | Ishimitsu et al. ........ 381/107 |
| 5,892,834 A | | 4/1999 | Smart et al. |
| 6,418,228 B1 | * | 7/2002 | Terai et al. ........... 381/71.8 |
| 2002/0076072 A1 | * | 6/2002 | Cornelisse .............. 381/312 |

FOREIGN PATENT DOCUMENTS

| | | |
|---|---|---|
| JP | 62-077710 | 4/1987 |
| JP | 05-244700 | 9/1993 |
| JP | 5-275950 | 10/1993 |
| JP | 10-026998 | 1/1998 |
| JP | 10-117115 | 5/1998 |

* cited by examiner

*Primary Examiner*—Vivian Chin
*Assistant Examiner*—Douglas J Suthers
(74) *Attorney, Agent, or Firm*—McDermott Will & Emery LLP

(57) ABSTRACT

A audio processing apparatus capable of judging and correcting volume levels of audio data, with a level judgment thinning controller for thinning the frequency of the level judgments provided therein, can reduce a throughput and implement the level judgments and corrections in the case of multi-channel input audio data maintaining the original number of the channels thereof. The audio processing apparatus, with a plurality of level judging devices and level correcting devices further provided therein, can implement audio processings at optional settings in response to users' preferences. The present invention thereby provides the capability of judging and correcting levels of the multi-channel audio data while maintaining the original number of the channels thereof.

22 Claims, 17 Drawing Sheets

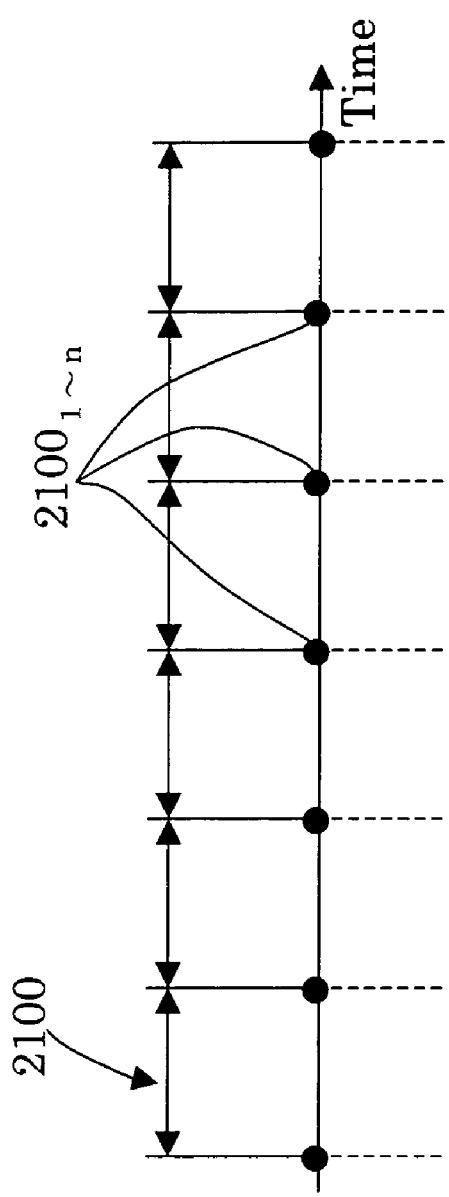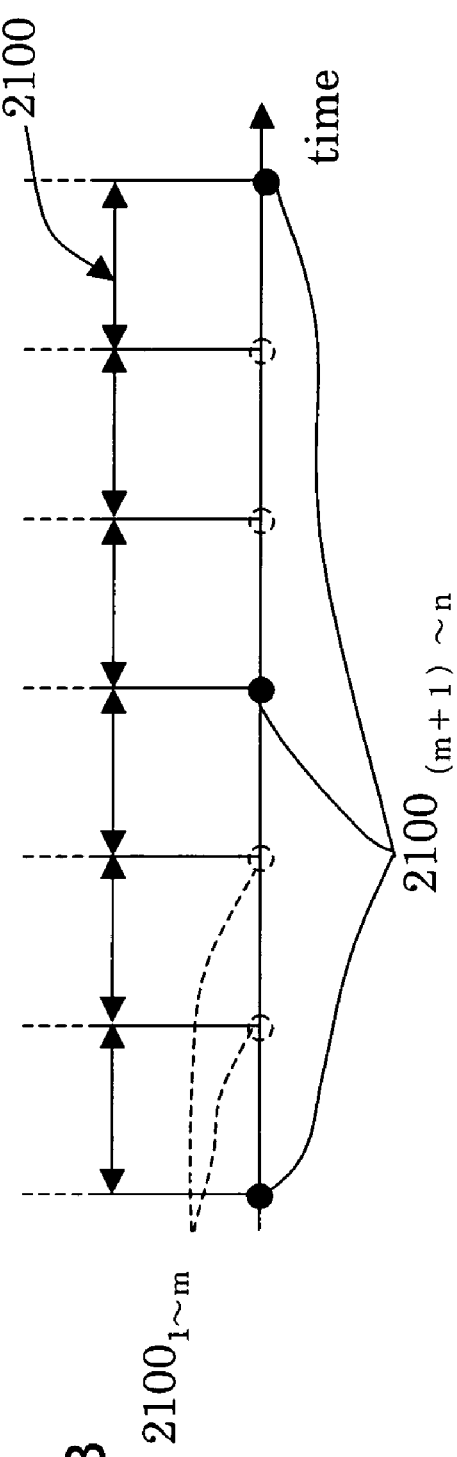
FIG. 3A
FIG. 3B

Level correction offset = level correction parameter 1 × relative comparison of parameter values + level correction parameter 2
= 2 × 3 + 4
= 10

Coefficient read-out address offset = level correction offset × coefficient data size
= 10 × 4
= 40
= 0 × 28     ※

F I G. 7

| tablse top address | data |
|---|---|
| +0x0000 | D1 |
| +0x0004 | D1 |
| +0x0008 | D2 |
| +0x000c | D3 |
| +0x0010 | D4 |
| +0x0014 | D5 |
| +0x0018 | D6 |
| +0x001c | D7 |
| +0x0020 | D8 |
| +0x0024 | D9 |
| +0x0028 | D10 |
| +0x002c | D11 |
| +0x0030 | D12 |
| +0x0034 | D13 |
| +0x0038 | D14 |
| +0x003c | D15 |
| +0x0040 | D16 |
| +0x0044 | D17 |
| +0x0048 | D18 |
| +0x004c | D19 |
| +0x0050 | D20 |
| +0x0054 | D21 |

| Function 1 (virtual) | Function 2 (band expansion) | Function 3 (equalizer) | Frequency of implementing judgment |
|---|---|---|---|
| OFF | OFF | OFF | 1 implementation / 2 samples |
| ON | OFF | OFF | 1 implementation / 4 samples |
| OFF | ON | OFF | 1 implementation / 8 samples |
| OFF | OFF | ON | 1 implementation / 4 samples |
| ON | ON | OFF | 1 implementation / 16 samples |
| ON | OFF | ON | 1 implementation / 8 samples |
| OFF | ON | ON | 1 implementation / 16 samples |
| ON | ON | ON | 1 implementation / 32 samples |

AUDIO PROCESSING APPARATUS FOR IMPLEMENTING LEVEL CORRECTIONS OF AUDIO DATA

FIELD OF THE INVENTION

This invention relates to a digital signal processing technology, more particularly, to a audio processing apparatus for implementing level corrections of audio data.

BACKGROUND OF THE INVENTION

The conventional sound source is mostly two-channel stereo audio. Therefore, a two-channel-wise audio processing is implemented in the case of a audio processing apparatus implementing level corrections of the conventional audio data. More specifically, volume levels are detected with respect to an inputted two-channel audio data and a level correction processing is implemented in accordance with the volume levels to thereby complete the level corrections of the audio data. This method is implemented by means of, for example, a audio processing apparatus shown in FIG. 17.

A conventional audio processing apparatus 5000 comprises a level judging unit 5100 and a level correcting unit 5200. The level judging unit 5100 judges whether the volume levels of the audio data inputted from outside are larger or smaller than a given reference volume. The level correcting unit 5200 implements the level corrections according to the volume levels judged by the level judging unit.

The level judging unit 5100 retrieves one sample data for each channel from the inputted two-channel audio data, and compares the retrieved data from the two channels to thereby employ the larger value as a level detection data. The level judging unit 5100 then compares the level detection data with the reference volume serving to judge the volume levels, and transmits the comparison results in the form of level judgment result signals to the level correcting unit 5200.

The level correcting unit 5200, based on the level judgment result signals from the level judging unit 5100, reduces the volumes when the inputted data is larger than the reference volume and increases the volumes when the inputted data is smaller than the reference volume. A smoothing processing is implemented between the output results in consequence of the foregoing processings and output data of a previous sample so that the smoothing-processed output is handled as output data of a current sample.

Such a audio processing apparatus is used for a vehicle-mounted audio apparatus and an audiovisual apparatus used in a limited volume at midnight. The audio processing apparatus, in the foregoing uses, can compress a dynamic range of the two-channel audio data, thereby enabling a small sound to be more easily heard. Therefore, the audio apparatus can be fully enjoyed in noise-penetrating environments such as a car interior and any situation where the sound volume must be reduced.

The apparatus employing the conventional audio processing is disclosed in No. 5-275950 of the publication of unexamined patent applications. According to the conventional technology, when the dynamic range of sound signals are compressed in the case of CD (compact disc) reproduction and the like, a property of excessive compression can be improved without deteriorating a distortion rate, and the dynamic range can be thereby normally compressed without any distortion.

In the case of processing DVD, which is rapidly spreading in recent years, and the like, it is necessary to process multi-channel audio data. When the conventional audio processing apparatus 5000 is applied to the multi-channel audio data, a possible method is to down-mix the multi-channel audio data into the two-channel one, which is thereafter inputted to the audio processing apparatus 5000. However, the audio processing apparatus 5000 can only emit the two-channel output in spite of the multi-channel input source. On top of that, there is a problem as follow.

The audio data has been increasingly diversified in accordance with the evolution of the multi-channel audio data. It can be hardly said to be flexibly responding to users' needs for the audio processing if the audio processing is implemented to all the sound sources at a universally common standard. In the case of the two-channel stereo sound source, it is not particularly necessary to change settings between the right and left channels. On the contrary, in the Dolby Digital, for example, five channels in total, which are a left front channel, right front channel, center channel, and surround two channels, and LFE (Low Frequency Effect) recording low-frequency sound effects are independently recorded and reproduced without being blended with one another. In such a case, an optimum setting is diverse depending on the sound sources, for example, the center channel should be pealed most, the front channel should be emphasized, LFE should be emphasized or the like. The multiple settings are even further diversified due to the users' needs. However, it is difficult to optionally change the settings in the configuration where the audio data is down-mixed into the two channel data.

SUMMARY OF THE INVENTION

Therefore, a main object of the present invention is to provide a audio apparatus capable of correcting volume levels of inputted audio data including multi-channel audio data while maintaining an original channel number thereof without down-mixing the inputted audio data into two-channel one.

Another object of the present invention is to provide a audio processing apparatus capable of optionally changing settings such as methods of judging levels, reference values, and degrees of level corrections depending on the kinds of the inputted audio data, users' preferences, and the like.

In order to solve the foregoing problem, the audio processing apparatus according to the present invention comprises:
 a level judging unit for judging volume levels of inputted audio data;
 a level correcting unit for correcting the volume levels based on the judgment results from the level judging unit; and
 a level judgment thinning controller for adjusting how often the level judgments should be implemented by the level judging unit.

BRIEF DESCRIPTION OF THE DRAWINGS

The foregoing and other aspects will become apparent from the following description of preferred embodiments and explicit in appended claims of the present invention. Many other benefits of the invention uncited in this specification will come to the attention of those skilled in the art upon implementing the invention.

FIGS. 3A and 3B are explanatory diagrams of a sampling period 2100.

FIG. 7 is a view showing a memory configuration of a calculating coefficient memorizing device.

FIG. 15 is an explanatory diagram of a judgment-frequency adjustment processing according to the Embodiment 2.

DESCRIPTION OF THE PREFERRED EMBODIMENTS

Figure 1:
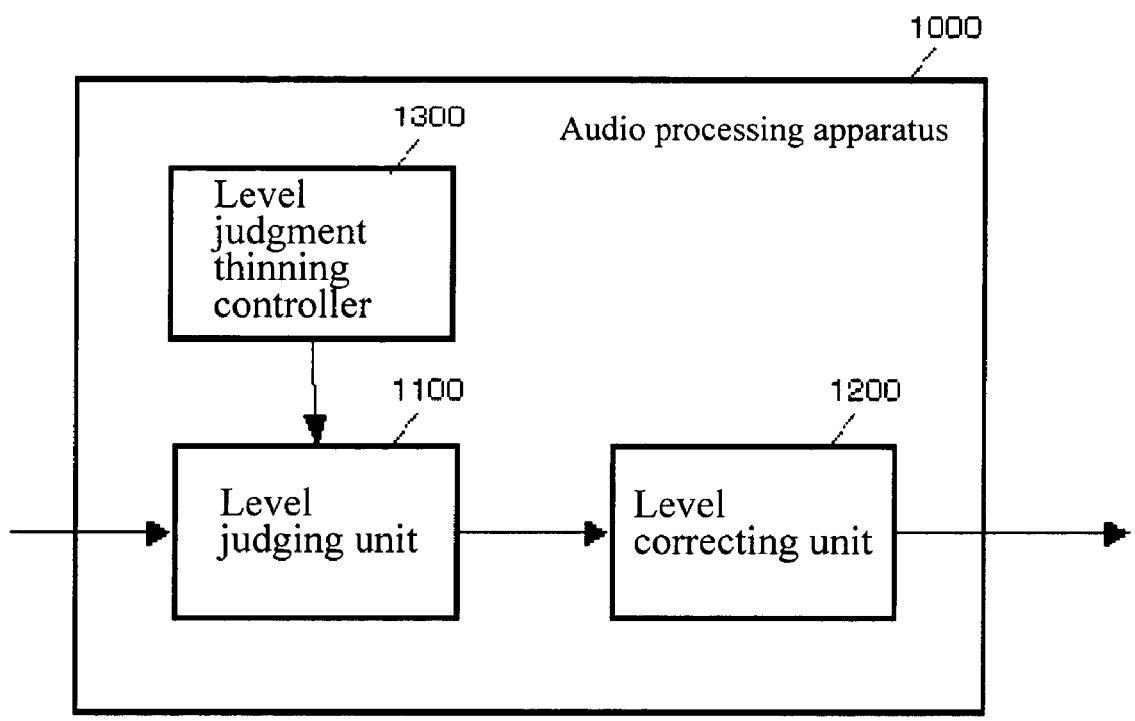
FIG. 1 is a view illustrating an entire configuration of a audio processing apparatus according to Embodiment 1 of the present invention.

Hereinafter, preferred embodiments of the present invention are described referring to the drawings.

Embodiment 1

FIG. 1 is a view illustrating a configuration of a audio processing apparatus 1000 according to Embodiment 1 of the present invention.

The audio processing apparatus 1000 comprises a level judging unit 1100, a level correcting unit 1200, and a level judgment thinning controller 1300. The present invention is characterized in that the level judgment thinning controller 1300 is provided in the audio processing apparatus.

The level judging unit 1100 is comprised of a plurality of level judging devices each capable of judging levels of at least audio data for one channel. In the same manner, the level correcting unit 1200 is comprised of a plurality of level correcting devices each capable of correcting levels of at least the audio data for one channel. The level judgment thinning controller 1300 thins the operation of the level judging unit 1100 with respect to the inputted audio data to thereby reduce a throughput.

The audio processing apparatus 1000, with the level judgment thinning controller 1300 provided therein, is capable of correcting volume levels of even the inputted audio data having a multiplicity of channels while maintaining the original number the channels without down-mixing the data into the two-channel data.

Figure 2:
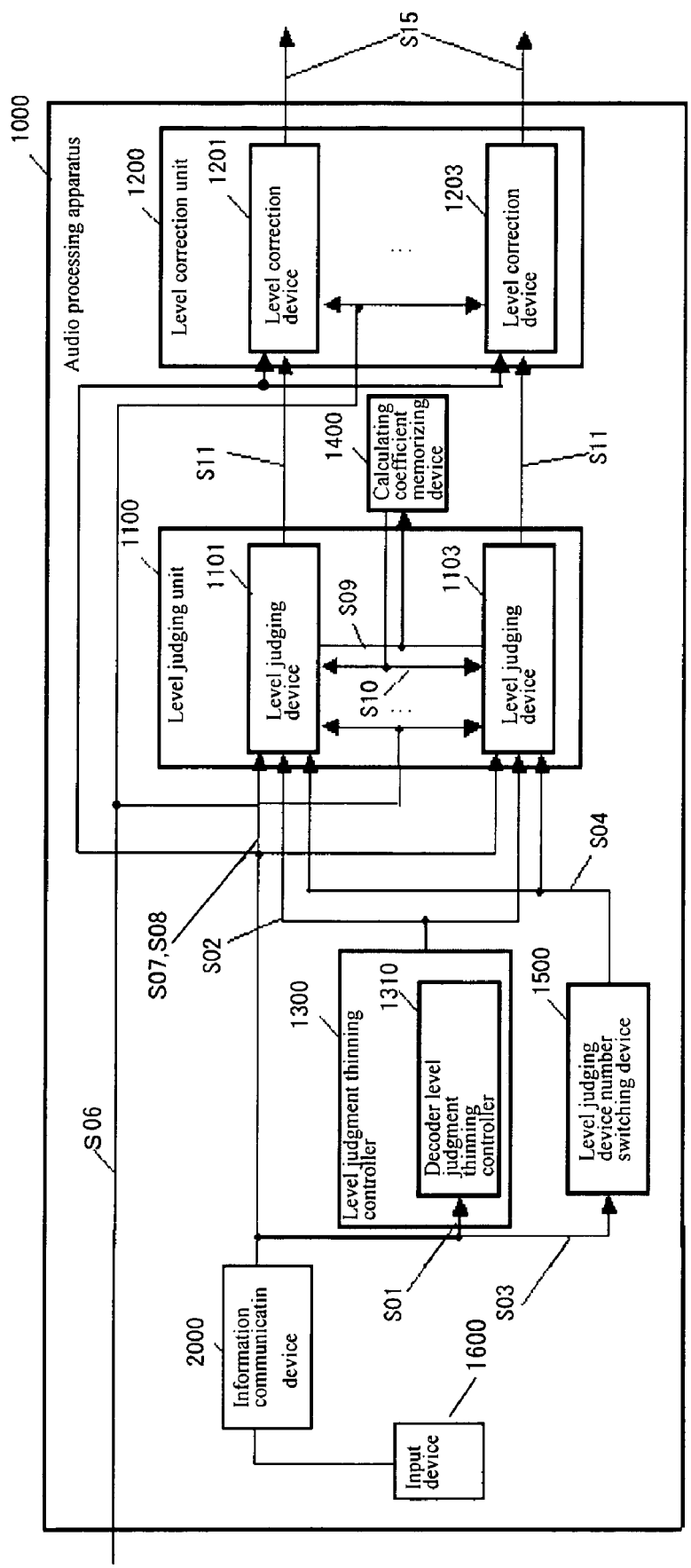
FIG. 2 is a view illustrating a specific configuration of the audio processing apparatus according to the Embodiment 1.

Referring to FIG. 2, the audio processing apparatus 1000 according to Embodiment 1 is further described in detail.

Described below is the case in which the inputted audio data is the multi-channel audio data. Any component in FIG. 2, which is identical to those in FIG. 1, has the same reference number.

The audio processing apparatus 1000 comprises a level judging unit 1100, level correcting unit 1200, level judgment thinning controller 1300, an information communicating device 2000, and an input device 1600.

The level judging unit 1100 comprises a plurality of (three in the present example) level judging devices 1101-1103 each having a similar structure. In the same manner, the level correcting unit 1200 comprises a plurality of level correcting devices 1201-1203 each having a similar structure. The respective level judging devices 1101-1103 and level correcting devices 1201-1203 correspond one on one to each other. The audio processing apparatus 1000 further comprises a calculating coefficient memorizing device 1400 and a level judging device number switching device 1500. The calculating coefficient memorizing device 1400 memorizes reference volumes respectively determined by first and second level correction parameters. The level judgment thinning controller 1300 comprises a per-decoder level judgment thinning controller switching device 1310.

The input device 1600, in response to input operation conducted by a user of the audio processing apparatus 1000, transmits the input operation information to the information communicating device 2000.

The operation of the audio processing apparatus 1000 is hereinafter described. The level judgment thinning controller 1300 receives decoder information S01 indicating signal forms of the input audio data via the information communicating device 2000. Signal forms in the present embodiment include, for example, stereo audio, the Dolby Digital, and the like. The decoder information S01 is the information appended to input audio data S06 and inputted from outside to the audio processing apparatus 1000 together with the input audio data S06.

A first level correction parameter S07 and a second level correction parameter S08 are supplied to the level judging unit 1100 from the information communicating device 2000. The parameters S07 and S08 received by the level judging unit 1100 are inputted to the respective level judging devices 1101-1103. The first and second level correction parameters S07 and S08 will be described later.

The level judgment thinning controller 1300 determines how often an thinning processing should be implemented based on the decoder information S01. To be more specific, the controller 1300, based on the decoder information S01 indicating the signal forms of the input audio data (stereo audio, the Dolby Digital, and the like), determines the thinning frequency suitable for the level judgment of each channel data of the audio data of the signal forms without any problem in any of the level judging devices 1101-1103. The controller 1300 transmits level judgment interval information S02 indicating the determined thinning frequency to the level judging a unit 1100.

The level judging device number switching device 1500 receives level judging device number information S03 indicating the number of the level judging devices 1101-1103 of the level judging unit 1100 suitable for processing the audio data via the information communicating device 2000. The level judging device number information S03 is inputted to the input device 1600 by the user of the audio processing apparatus 1000 to be thereby supplied to the information communicating device 2000. To describe the number of the level judging devices suitable for processing the audio data, it refers to the number of the level judging devices matching with the number of the channels of the audio data. The number of the level judging devices corresponding one on one to the respective channels of the audio data is designated by means of the level judging device number information S03. However, any single level judging device of the level judging unit 1100 may be designated to correspond to the multiple channels of the audio data.

The level judging device number switching device 1500, based on the designated number of the level judging devices, creates operation-instructing information S04 and transmits the information S04 to the level judging unit 1100. At that time, the level judging device number switching device 1500 implements the following processing based on the level judging device number information S03. The level judging device number information S03 designates the number of the level judging devices 1101-1103 corresponding to the respective channels of the audio data (multi-channel data) inputted as described. The level judging device number switching device 1500, in the wake of receiving the level judging device number information S03 indicating the described information, specifies the X number (X≦the total number of the level judging devices) of the level judging devices 1101-110X designated from the plural level judging devices 1101-1103 by the level judging device number information S03. The level judging device number switching device 1500 then transmits the operation-instructing information S04 to the designated level judging devices 1101-110X respectively. The level judging device number switching device 1500 thereby designates the level judging devices 1101-110X judging the levels of the respective channel data of the inputted audio data and transmits the operation-instructing information S04 to the designates level judging devices 1101-110X.

The level judging devices 1101-110X, in the wake of receiving the operation-instructing information S04, implements the judgments. Specifically, the level judging devices 1101-110X implement the level judgments with respect to the input audio data based on the operation-instructing information S04 and level judgment interval information S02. The level judging devices 1101-110X, in doing so, implement the judgments while thinning the level judgment processing at a frequency level designated by the level judgment interval information S02. More specifically, the level judging devices 1101-110X do not implement the level judgments at all time points of a sampling period 2100 set in the audio processing apparatus 1000, as shown in FIG. 3A. The level judging devices 1101-110X periodically thin an optional number of time points $2100_{1-m}$ (m<n) from all the time points $2100_{1-n}$ defined in the sampling period 2100 based on an optional thinning period, as shown in FIG. 3B, to thereby implement the judgment processing at the remaining time points $2100_{(m+1)-n}$. For example, the level judging devices 1101-110X implement the judgment processing at a time point for every eight time points in all the time points $2100_{1-n}$, thus dispensing with (thinning) the judgment processing at the remaining seven time points.

In this manner, the overall number of the level judgments is reduced so that the level judgments can be implemented without creating any problem caused by the throughput overload of the level judging devices 1101-1103.

The operation of the level judging devices 1101-110X is described further in detail. The level judging devices 1101-110X, in response to the reception of the first and second level correction parameters S07 and S08 via the information communicating device 2000, creates calculating coefficient address information S09 based on the first and second level correction parameters S07 and S08 and transmits the information S09 to the calculating coefficient memorizing device 1400. The first and second level correction parameters S07 and S08 are inputted to the input device 1600 by the user of the audio processing apparatus 1000 and subsequently supplied to the information communicating device 2000 from the input device 1600. The calculating coefficient address information S09 is described as follows. The calculating coefficient memorizing device 1400 store substantive values of the reference data for the respective audio data. The calculating coefficient address information S09 is the address information designating the storing positions of the reference audio data in the calculating coefficient memorizing device 1400.

The calculating coefficient memorizing device 1400, in response to the reception of the calculating coefficient address information S09, reads out substantive values of reference volume data S10 addressed by means of the calculating coefficient address information S09 from the entire substantive values of the memorized reference volume data and transmits the read-out substantive values to the level judging devices 1101-110X.

The level judging devices 1101-110X, in response to the reception of the substantive values of the reference volume data S10, retrieve the channel data respectively allocated to the level judging devices 1101-110X from the received input audio data S06 to compare the retrieved channel data with the substantive values of the reference volume data S10 for judging which is larger or smaller than the other and transmits level judgment result signals S11 representing the comparison results to the level correcting devices 1201-120X. The level judgment result signals S11 are transmitted to the level correcting devices 1201-120X respectively corresponding to the level judging devices 1101-110X.

The level correcting devices 1201-120X, in response to the reception of the level judgment result signals S11, correct the inputted audio based on the judgment results and send out output audio data S15. At this point, a series of the level corrections implemented by the audio processing apparatus 1000 are completed.

Figure 4:
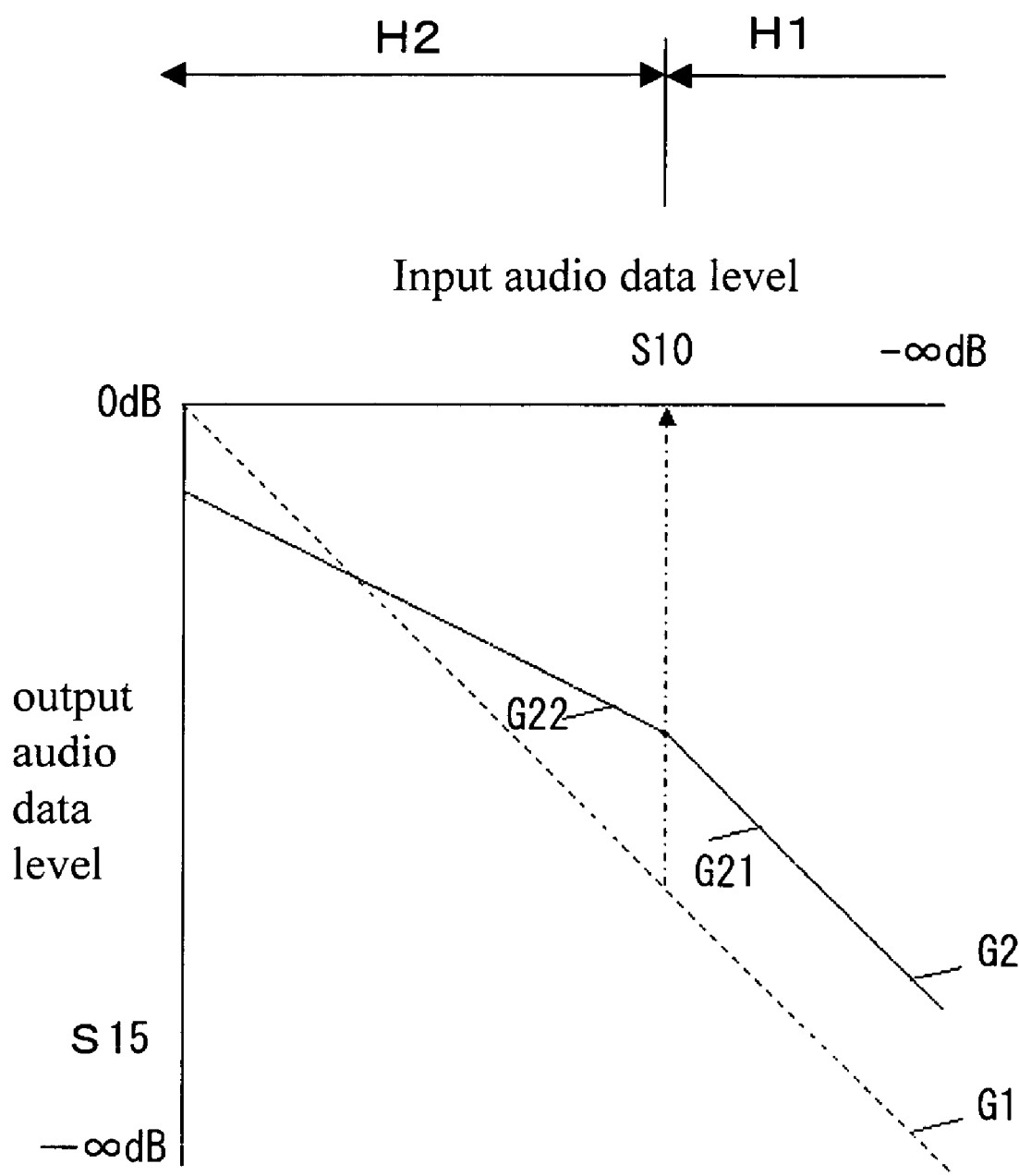
FIG. 4 is a graph showing an example of volume levels of inputted audio data and corresponding volume levels of outputted audio data with respect to the audio processing apparatus according to the Embodiment 1.

FIG. 4 is a view of a graphed relationship between the levels of the input audio data inputted to the audio processing apparatus 1000 and the levels of the corresponding output audio data. A graph G1 shows the case of implementing no level corrections, and a graph G2 shows an example of correction patterns in the case of implementing the level corrections.

The level correcting devices 1201-1203, in the wake of receiving the level judgment result signals S11 from the corresponding level judging devices 1101-1103, decode the level judgment result signals S11 to thereby judge whether the volume levels of the channel data corresponding to the level correcting devices 1201-1203 are larger or smaller than the substantive values of the reference volume data S10.

When the judgment results in "larger", it is judged that the input audio level is within the range of a audio level region H2 arranged on the left side in FIG. 4 with respect to the reference volume data S10. The channel data is then corrected based on a correction pattern (correction property) suitable for the audio level region H2 so that the level of the output audio data is reduced with respect to the level of the input audio data.

On the contrary, when the judgment results in "smaller", it is judged that the input audio level is within the range of a audio level region H1 arranged on the right side in FIG. 4 with respect to the reference volume data S10. The channel data is then corrected based on a correction pattern (correction property) suitable for the audio level region H1 so that the level of the output audio data is increased by a predetermined degree with respect to the level of the input audio data.

Figure 5:
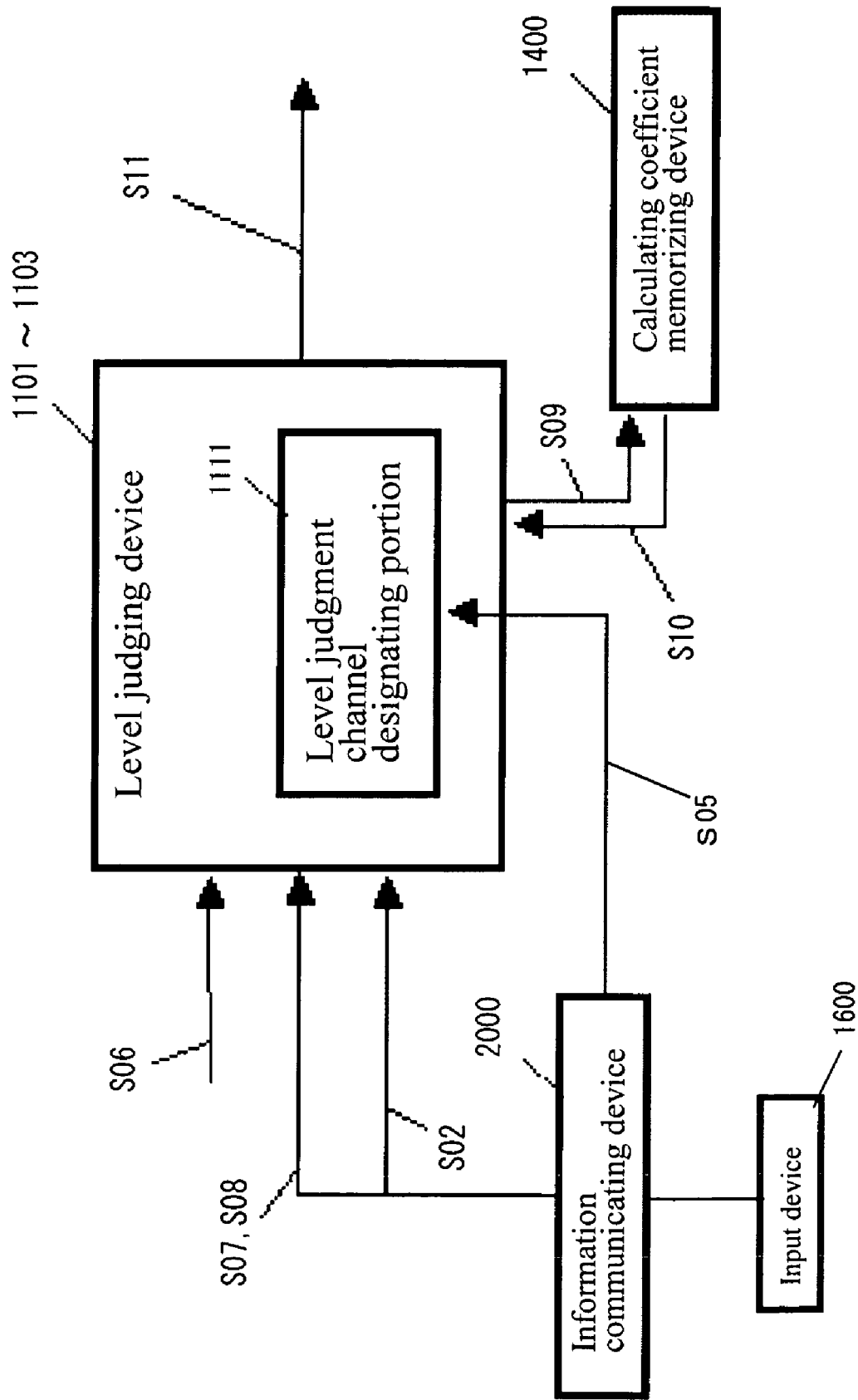
FIG. 5 is a view showing a configuration of level judging devices according to the Embodiment 1.

The operation of the level judging unit 1100 is described further in detail referring to FIG. 5. The respective level judging devices 1101-1103 of the level judging unit 1100 comprise level judgment channel designating portions 1111. The level judgment channel designating portions 1111 receive level judgment channel information S05 via the information communicating device 2000. The level judgment channel information S05 is the information inputted by the user of the audio processing apparatus to the information communicating device 2000 via the input device 1600 and serves to designate the channels subject to the level judgments in the input audio data S06.

The level judgment channel designating portions 1111, based on the received level judgment channel information S05, designates the channels subject to the level judgments in the level judging devices 1101-1103 having the level judgment channel designating portions 1111 incorporated therein. The designated channels can be single or plural. For example, in the case of the audio data according to the Dolby Surround System, the level judgment channel designating portions 1111 may collectively handle the audio data from the right and left channels as a single audio data subject to the judgment. In such a case, the level judgment channel designating portions 1111 determine a pair of audio data (right and left) as the channel to be judged. As described, the respective channels are designated by the level judgment channel designating portions 1111 based on the level judgment channel information S05.

The level judging devices 1101-1103 read out one sample of the channel data of the channels designated by the level judgment channel designating portions 1111 from the input audio data S06, which is handled as level detection data. When a plurality of the channels is designated as the channels subject to the level judgments, for example, the maximum values thereof are selected. The substantive values of the reference volume data S10 for judging the volume levels are stored in the calculating coefficient memorizing device 1400 as a coefficient table. The level judging devices 1101-1103 read out the substantive values of the reference volume data stored at the address positions in the calculating coefficient memorizing device 1400 determined based on the first and second level correction parameters S07 and S08 received from the input device 1600 via the information communicating device 2000.

The first level correction parameter S07, as described earlier, determines the output level of the output audio data S15 in the audio level region H1 in the case of the input volume level being smaller than the reference volume data S10 and corresponds to a correction pattern G21 in FIG. 4. In the same manner, the second level correction parameter S08 determines the output level of the output audio data S15 in the audio level region H2 in the case of the input volume level being larger than the reference volume data S10 and corresponds to a correction pattern G22 in FIG. 4.

The first and second level correction parameters S07 and S08 are created by the information communicating device 2000 based on correction-property information of the user's choice inputted to the input device 1600 by the user of the audio processing apparatus 1000 and supplied to the level judging devices 1101-1103.

The correction pattern G21 is defined according to the following formula (first linear expression).

$$Y = a_1 X + b_1$$

X: input audio data of audio processing apparatus
Y: output audio data of audio processing apparatus $a_1$: amplification coefficient of input audio data X, for which a fixed value is provided. ($a_1$=1, in the present embodiment)
$b_1$: value of first level correction parameter S07, subject to optional change by input device 1600

As is clear from the foregoing formula, the first level correction parameter S07 is a y piece in the correction pattern G21, more specifically, represents values added to or deducted from the input audio data S06 in order to calculate the output audio data S15. The correction pattern G22 is defined according to the following formula (second linear expression).

$$Y = a_2 X + b_2$$

X: input audio data of audio processing apparatus
Y: output audio data of audio processing apparatus
$a_2$: amplification coefficient of input audio data X, for which a fixed value is provided. ($a_2$=1, in the present embodiment)
$b_2$: value of second level correction parameter S08, subject to optional change by input device 1600

As is clear from the foregoing formula, the second level correction parameter S08 is a y piece in the correction pattern G22, more specifically, represents values added to or deducted from the input audio data S06 in order to calculate the output audio data S15.

The reference volume data S10 indicates the volume level on the borderline between the adjacent audio level regions H1 and H2 and is obtained as X value (input audio data S06) at an intersecting point of the formulas for the correction patterns G21 and G22.

When the correction patterns G21 and G22 are determined based on the settings of the first and second level correction parameters S07 and s08, the reference volume data S10 representing the intersecting point is uniquely determined. Therefore, the level judging devices 1101-1103 can specify the substantive values of the reference volume data S10 in the calculating coefficient memorizing device 1400 using the first and second level correction parameters S07 and S08.

Figure 6:
FIG. 6 is a table showing a relationship between a first level correction parameter and a second level correction parameter according to the present invention.

FIG. 6 is a table showing the borderline specifying data for specifying the reference volume data S10 based on the correlation between the first and second level correction parameters S07 and S08. The borderline specifying data of the reference volume data S10 is comprised of step values, for which 22 steps, from a value "0" up to a value "21", are set. The borderline specifying data is defined as an amount of displacement representing the displacement from the reference level 0 db toward −∞db. The value "0" is the value closest to the 0 db level, and the value "21" is the value closest to the −∞db. More specifically, the larger the borderline specifying data of the reference volume data S10 is, the closer it is to the −∞db. The borderline specifying data of the reference volume data S10 thus defined is referred to as a level correction offset.

The level correction offset does not represent the substantive values of the reference volume data S10 stored in the calculating coefficient memorizing device 1400. The substantive values of the reference volume data S10 are arranged to correspond to the level correction offset and then stored in the calculating coefficient memorizing device 1400.

The table shown in FIG. 6 is based on the assumption that the following conditions are set.

The levels of the adjustment with respect to the first level correction parameter S07 implemented by the user to the input device 1600 are set in six steps, from 0-5.

In response to the adjustment in one step with respect to the first level correction parameter S07 implemented by the user to the input device 1600, the substantive values of the level correction offset range within the triple step interval (3).

The levels of the adjustment with respect to the second level correction parameter S08 implemented by the user to the input device 1600 are set in seven steps, from 0-6.

In response to the adjustment in one step with respect to the second level correction parameter S08 implemented by the user to the input device 1600, the substantive values of the level correction offset range within the identical step interval (1).

In the table of FIG. 6 created based on the foregoing conditions, the level correction offset obtains 42 values calculated from 6×7=42, based on the six-step adjustment levels with respect to the first level correction parameter S07 and seven-step adjustment levels with respect to the second level correction parameter S08.

Further, in response to the one-step adjustment with respect the first level correction parameter S07 implemented by the user to the input devices 1600, the substantive values of the level correction offset range within the three-step interval. In contrast to that, in response to the one-step adjustment with respect the second level correction parameter S08 implemented by the user to the input devices 1600, the substantive values of the level correction offset range in the one-step interval.

As described, the 22 steps from the value "0" to the value "21" are set for the substantive values of the level correction offset. Apparent from the closer look at the table of FIG. 6, many of the values overlap with one another in the 42 different level correction offset. Therefore, in the calculating coefficient memorizing device 1400, there are 22 substantive values of the level correction offset in consequence of eliminating the overlapped values of the level correction offset, as shown in FIG. 7. There are 22 substantive values, D0-D21, of the reference volume data S10 corresponding to the 22 substantive values of the level correction offset. The 22 substantive value data D0-D21 of the reference volume data S10 are sequentially stored in 22 memory regions of the calculating coefficient memorizing device 1400.

The substantive value data D0-D21 of the reference volume data S10 are read out from the calculating coefficient memorizing device 1400 having the reduced data volume as described based on the first and second level correction parameters S07 and S08 as follows.

Figure 8:
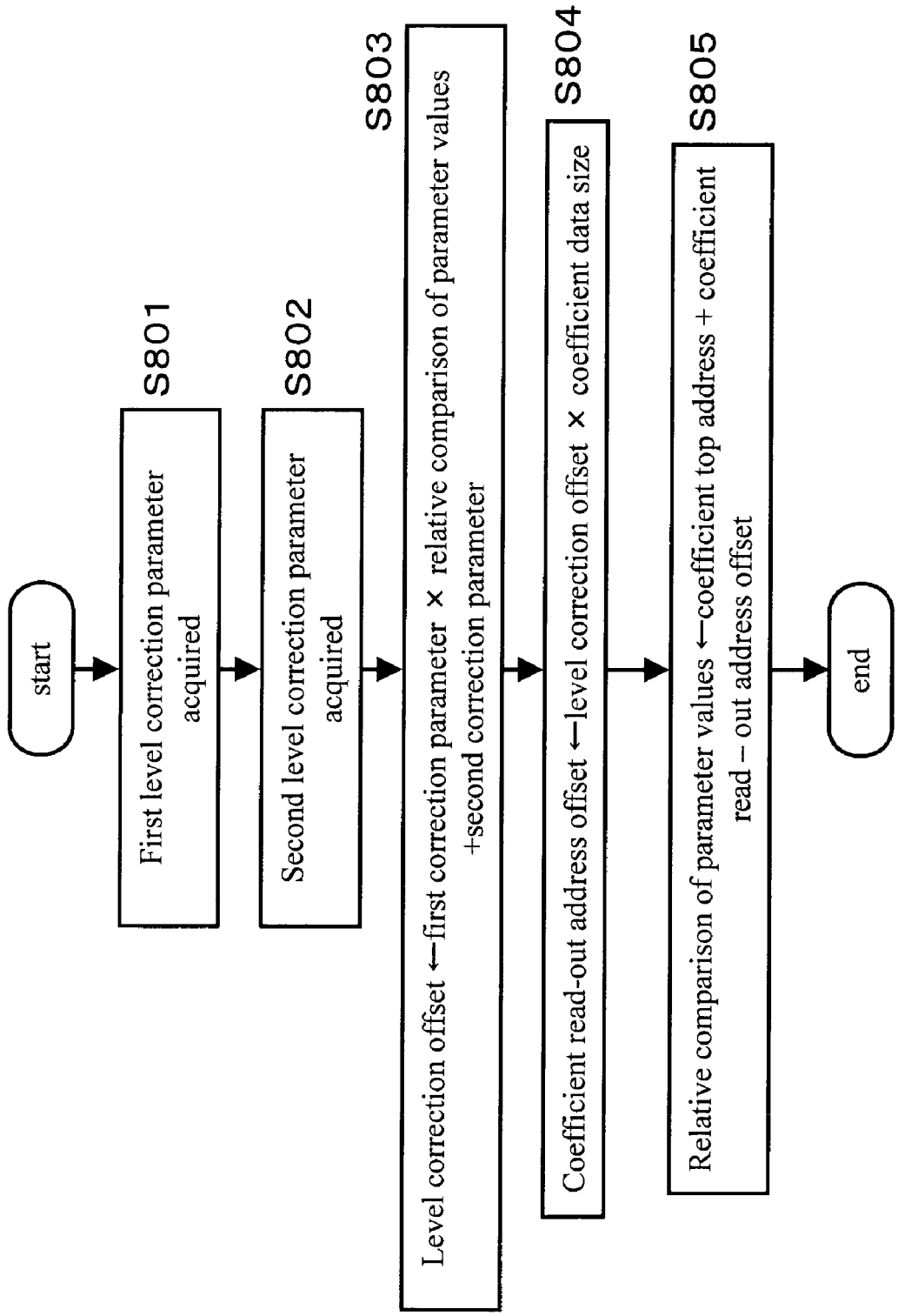
FIG. 8 is a flow chart showing a setting method of a calculating coefficient according to the present invention.

FIG. 8 is a flow chart showing a reading-out step of the substantive values D0-D21 of the reference volume data S10 from the calculating coefficient memorizing device 1400.

First, the information communicating device 2000 creates the first and second level correction parameters S07 and S08 based on the input values of the input device 1600 and outputs the parameters S07 and S08. The level judgment channel designating portion 1111 acquires the first and second level correction parameters S07 and S08 outputted by the information communicating device 2000 (S801, S802).

Next, the acquired first and second level correction parameters S07 and S08 are applied to the following formula so that the level correction offset is calculated (S803).

$$\text{level correction offset} = \text{relative comparison between first and second level correction parameters } S07 \text{ and } S08 + \text{second level correction parameter } S08$$

A relative comparison C1 between the first level correction parameters S07 and S08 represents a relative comparison between an output variation C2 of the substantive values of the first level correction parameter S07 relative to the input adjustment level with respect to the first level correction parameter S07 and an output variation C3 of the substantive values of the second level correction parameter S08 relative to the input adjustment level with respect to the second level correction parameter S08, and, more specifically, is obtained according to the following formula.

$$C1 = C2/C3$$

In the present embodiment, C1=3/1=3 is obtained.

Based on the level correction offset obtained in the S803, the level judging devices 1101-1103 read out the substantive value data D0-D21 of the reference volume data S10 from the calculating coefficient memorizing device 1400.

More specifically, as shown in the following formula, the level correction offset is multiplied by a coefficient data size of the calculating coefficient memorizing device 1400 so that a coefficient read-out address offset is calculated (S804).

$$\text{coefficient read-out address offset} = \text{level correction offset} \times \text{coefficient data size}$$

The coefficient read-out address offset refers to the offset showing an interval between a top address in the memory regions storing the substantive value data D0-D21 of the reference volume data S10 and an address position storing the current substantive data Dn ($0 \leq n \leq 21$) in the calculating coefficient memorizing device 1400.

Next, the coefficient read-out address offset calculated in the S804 is added to the top address of the calculating coefficient memorizing device 1400. Thereby, the address of the memory region storing the substantive value data Dn of the reference volume data S10 is specified in the calculating coefficient memorizing device 1400 (S805).

The addresses calculated in the S805 constitute the calculating coefficient address information S09. The calculating coefficient address information S09 is transmitted to the calculating coefficient memorizing device 1400 from the level judging devices 1101-1103. In the calculating coefficient memorizing device 1400, the substantive value data Dn of the reference volume data S10 stored at the address represented by the calculating coefficient address information S09 are read out and transmitted to the level judging devices 1101-1103.

The level judging devices 1101-1103 compares the volume levels of the level detection data with the volume levels of the reference volume data S10 and transmits the level judgment result signals S11 representing the comparison results of the comparison, to the level correcting devices 1201-1203.

As described, in the level judging devices 1101-1103, the relationship between the overlapped step values of the reference volume data S10 and the substantive value data D0-D21 of the reference volume data S10 is organized by means of the foregoing read-out step set as described. Therefore, the substantive value data D0-D21 of the reference volume data S10 can be stored without any overlapping in the calculating coefficient memorizing device 1400. In this manner, a memory capacity required for the calculating coefficient memorizing device 1400 can be reduced, which leads to a cost reduction.

Figure 9:
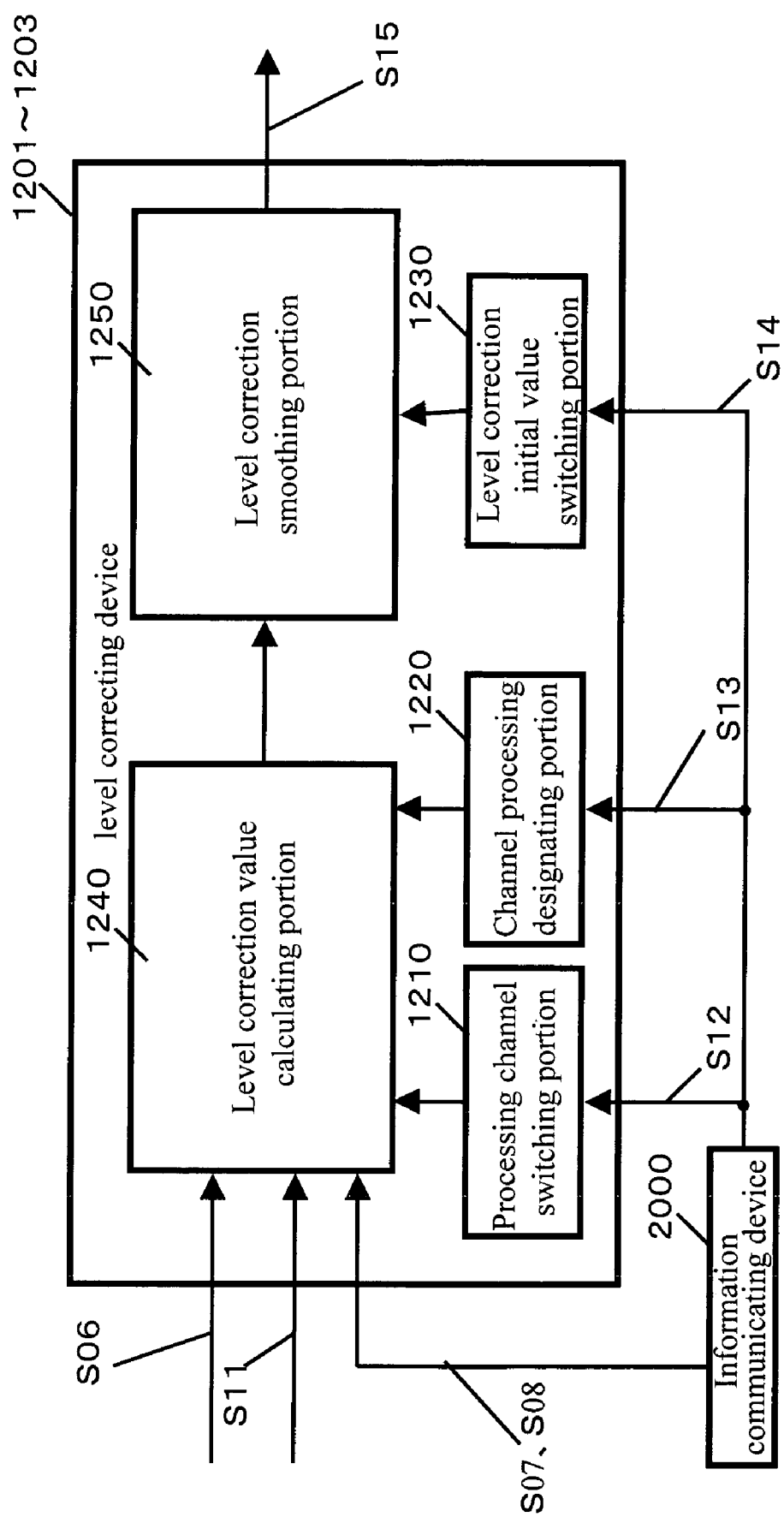
FIG. 9 is a view illustrating a configuration of level correcting devices according to the Embodiment 1.

The operation of the level correcting devices 1201-1203 is described. FIG. 9 shows a configuration of the level correcting devices 1201-1203. The level correcting devices 1201-1203 comprise processing channel switching portions 1210, channel processing designating portions 1220, level correction initial value switching portions 1230, level correction value calculating portions 1240, and level correction smoothing portions 1250.

The level correcting devices 1201-1203 receive, via the information communicating device 2000, the first and second level correction parameters S07 and S08, processing channel information S12, channel processing designation information S13, and level correction initial value information S14. The mentioned information, S07, S08, S12, S13, and S14 are inputted to the input device 1600 by the user of the audio processing apparatus 1000. The information, S12, S13, and S14 are not shown in FIG. 2.

The processing channel switching portions 1210 determine the channels of the audio data to be respectively level-corrected by the level correcting devices 1201-1203 based on the received processing channel information S12.

The channel processing designating portions 1220 determine whether or not the level corrections are implemented to the channels, which the respective level correcting devices 1201-1203 are in charge of in implementing the level corrections. Whether or not the level corrections are implemented is determined based on the channel processing designation information S13 received by the level correcting devices 1201-1203 via the information communicating device 2000. The channel processing designation information S13 is the data to be set and inputted to the audio processing apparatus 1000 by the user of the audio processing apparatus 1000.

The level correction initial value switching portions 1230 determine level correction initial values of the level correcting devices 1201-1203 based on the level correction initial value information S14 received via the information communicating device 2000.

The level correction value calculating portions 1240 implement the following level corrections based on the level judgment result signals S11 received from the corresponding level judging devices 1101-110X. When the level judgment result signals S11 show (input audio data S06>reference volume data S10), the level correcting devices 1201-120X implement the processing reducing the output levels of the respective channel data, which the devices 1201-120X are respectively responsible for, to be smaller than the input levels thereof in compliance with the correction pattern G22 determined by the second level correction parameter S08. On he contrary, when the level judgment result signals S11 show (input audio data S06<reference volume data S10), the level correcting devices 1201-120X implement the processing increasing the output levels of the respective channel data, which the devices 1201-120X are responsible for, to be larger than the input levels thereof in compliance with the correction pattern G21 determined by the first level correction parameter S07. The channels to be respectively processed by the level correcting devices 1201-120X are designated by the processing channel switching portions 1210.

The level correction smoothing portions 1250 implement a smoothing processing between the level-corrected data outputted from the level correction value calculating portions 1240 and the data level-corrected at the time of the previous sampling. The level correction smoothing portions 1250 then output the smoothing-processed data as the output audio data S15 at the time of the current sampling.

Figure 10:
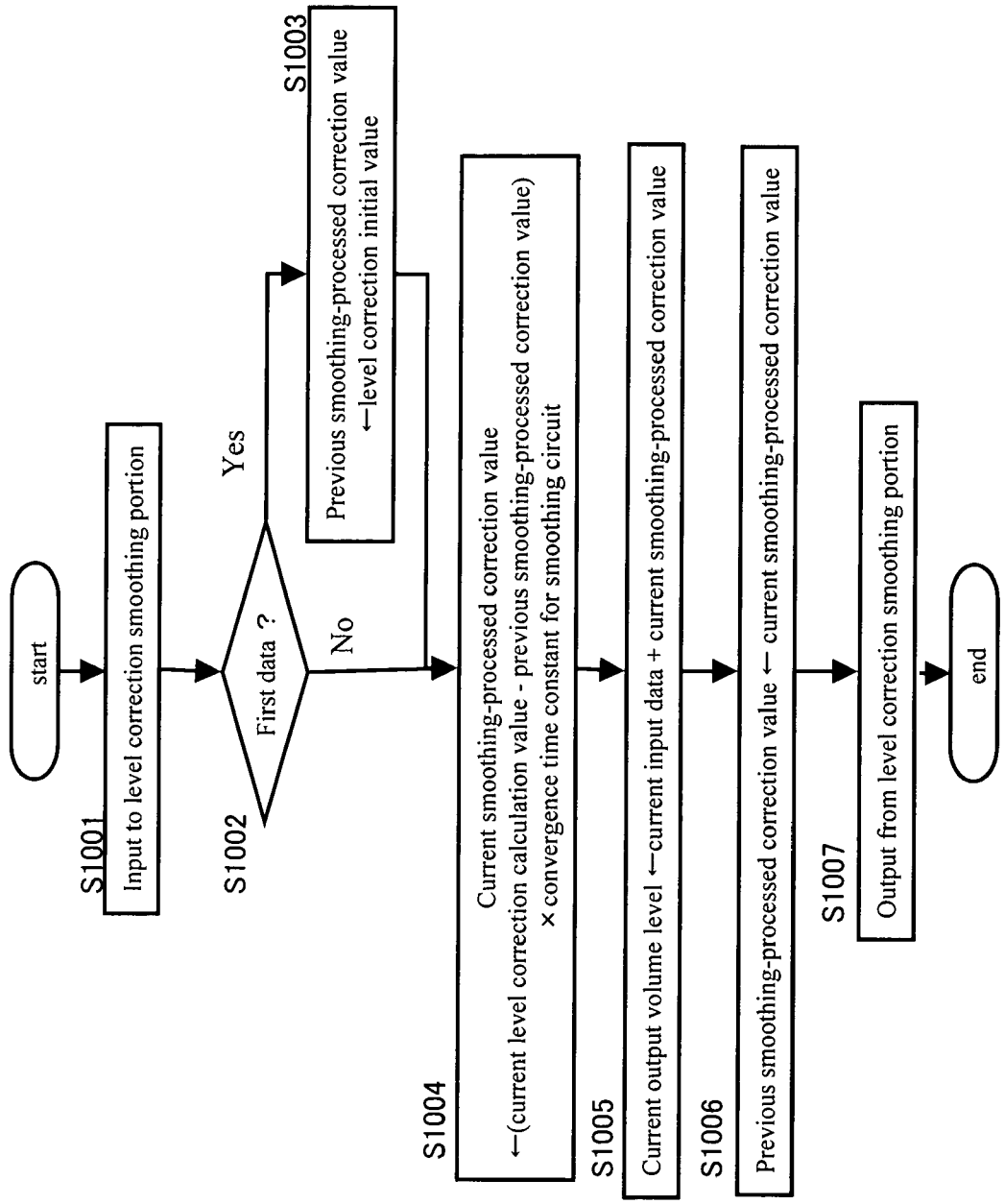
FIG. 10 is a flow chart showing a smoothing processing implemented by a level correction smoothing portion.

The details of the smoothing processing are described referring to the flow chart of FIG. 10. The smoothing processing described below is basically implemented by the level correction smoothing portions 1250 unless stated otherwise.

After the current level correction calculation values are inputted from the level correction value calculating portions 1240 (S1001), the level correction initial value switching portions 1230 judge whether or not the inputted current level correction calculation values are the inputted data to be first processed (S1002).

When it is judged in the S1002 that the inputted current level correction calculation values are not the inputted data to be first processed, the level correction initial value switching portions 1230 output the instruction that the previous smoothing-processed correction values sequentially updated and recorded in the level correction smoothing portions 1250 are used as the previous smoothing-processed correction values without change to the level correction smoothing portions 1250.

On the contrary, when it is judged in the S1002 that the inputted current level correction calculation values are the inputted data to be first processed, the level correction initial value switching portions 1230 output the instruction that the level correction initial values designated by the level correction initial value information S14 in the level correction smoothing portions 1250 are used as the previous smoothing-processed correction values (S1003).

After the S1001-S1003 described above are implemented in the level correction initial value switching portions 1230, the level correction smoothing portions 1250 calculate the current smoothing-processed correction values according to the following formula (S1004).

$$\begin{matrix} \text{current smoothing-} \\ \text{processed} \\ \text{correction value} \end{matrix} = \left( \begin{matrix} \text{current level} \\ \text{correction} \\ \text{calculation} \\ \text{value} \end{matrix} - \begin{matrix} \text{previous} \\ \text{smoothing-} \\ \text{processed} \\ \text{correction} \\ \text{value} \end{matrix} \right) \begin{matrix} \text{convergence} \\ \text{time} \\ \times \text{constant for} \\ \text{smoothing} \\ \text{circuit} \end{matrix}$$

After the current smoothing-processed correction values are calculated in the S1004, the level correction smoothing portions 1250 calculate the current corrected output volume levels (already smoothing-processed) in their relevant channel data to be corrected according to the following formula (S1005).

$$\begin{matrix} \text{current output} \\ \text{volume level} \end{matrix} = \begin{matrix} \text{current level} \\ \text{correction} \\ \text{calculation value} \end{matrix} - \begin{matrix} \text{current smoothing-} \\ \text{processed} \\ \text{correction value} \end{matrix}$$

After the current corrected output volume levels (already smoothing-processed) in the relevant channel data to be corrected are calculated in the S1005, the level correction smoothing portions 1250, in order to move on to the next correction processing, update and record the current smoothing-processed correction values as the previous smoothing-processed correction values (S1006). After the implementation of the so-far described, the current corrected output volume levels (already smoothing-processed) are outputted to outside from the level correction smoothing portions 1250 (S1007).

Figure 11:
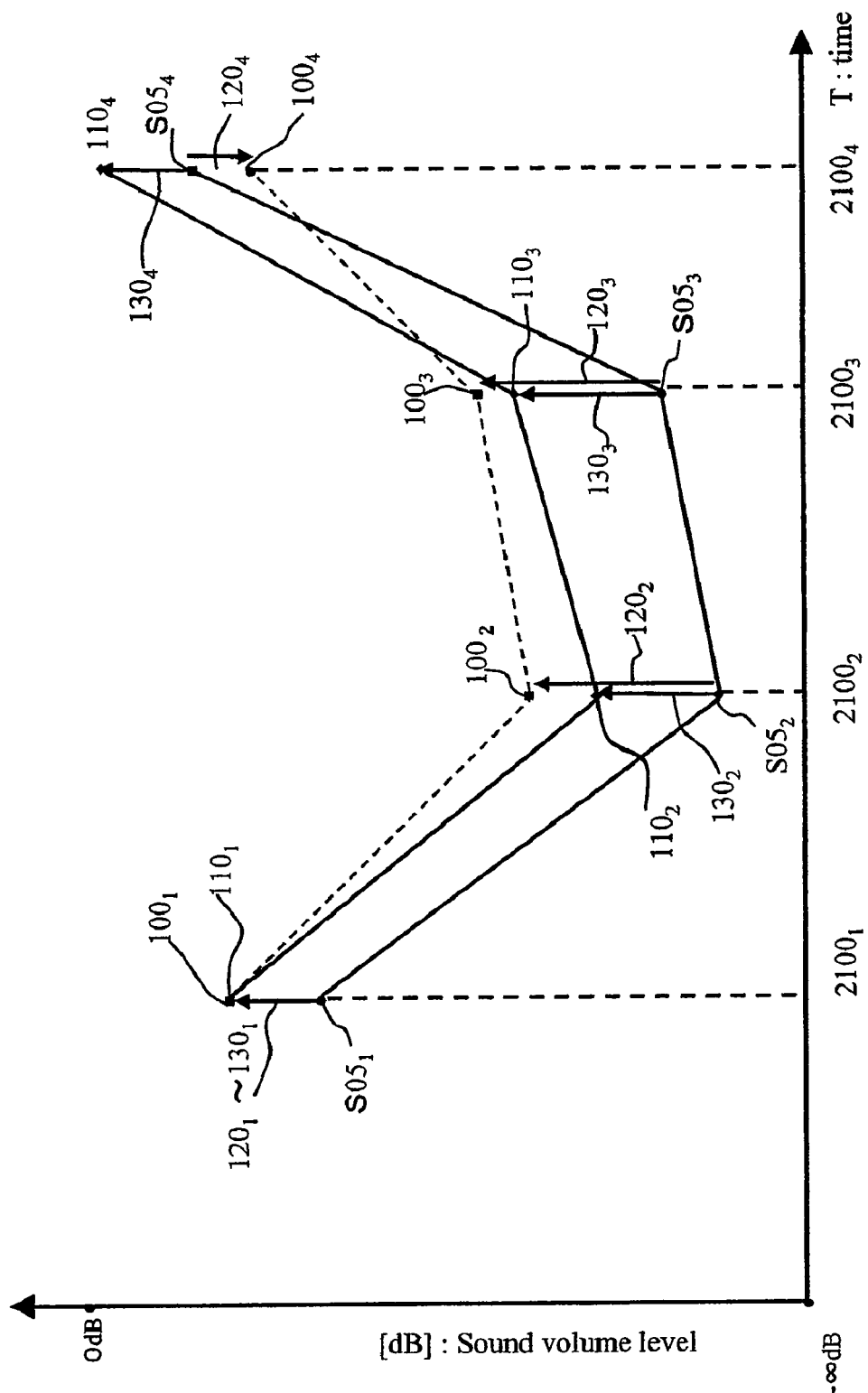
FIG. 11 is a view showing an effect of the smooth processing implemented by the level correction smoothing portion.

In FIG. 11, an effect of the smoothing processing implemented by the level correction smoothing portions 1250 is shown. FIG. 11 shows correction outputs of the level correction calculating portions 1240 and smoothing outputs of the level correction smoothing portions 1250 at time points in chronological order in the sampling period 2100 of the audio processing apparatus 1000. In FIG. 11, $S05_{1-3}$ are sampling values of the input audio data at the time points $2100_{1-3}$. References $100_{1-3}$ are the before-mentioned correction outputs at the time points $2100_{1-3}$, $110_{1-3}$ are the before-mentioned smoothing outputs at the time points $2100_{1-3}$, $120_{1-3}$ are the level correction calculation values at the time points $2100_{1-3}$, and $130_{1-3}$ are the smoothing-processed correction values at the time points $2100_{1-3}$.

As is clear from FIG. 11, the smoothing-processed correction values $130_{2,3}$ at the time points $2100_{2,3}$ can be smaller or larger than the level correction calculation values $120_{2,3}$ at the identical time points $2100_{2,3}$, however, the smoothing outputs $110_{2,3}$ are smaller than the correction outputs $100_{2,3}$ in variation. The variation here means the variation of the smoothing outputs $110_{2,3}$ and the level correction calculation values $120_{2,3}$ with respect to the sampling values $S05_{2,3}$ at the identical time points $2100_{2,3}$.

The smoothing processing thus implemented enables the outputted output audio data S15, in spite of the level corrections implemented thereto, to be more easily heard.

When it is decided in the channel processing designating portions 1220 that the level corrections are not implemented, the level correcting devices 1201-1203 do not implement the level corrections for their relevant channels, and the input audio data S06 is outputted as the output audio data S15 without change.

In the described S1002, when it is judged that the current level correction calculation values are the first data to be processed, the level correction initial values designated by the level correction initial value information S14 are used as the previous smoothing-processed correction values.

The level correction initial values in the foregoing case are optionally set in the range between the maximum value of the volume level (=0 dB) and the minimum value of the volume level (=–∞db).

Followings are three examples of the level correction initial values.

1 level correction calculation value first subject to the processing.
2 level correction value when the volume level is at the maximum value (=0dB).
3 level correction value when the volume level is at the minimum value (=–∞db).

In the case of 1, the previous smoothing-processed correction values first subject to the processing at the time point $2100_s$ in the sampling period are same as the level correction calculation values at the time point $2100_s$ in the sampling period. This results in (current level correction calculation value–previous level correction calculation value=0), and the current smoothing-processed correction values also result in 0. Because of that, the smoothing processing is not implemented, the corrected output audio levels (already smoothing-processed) at the time point $2100_s$ in the sampling period are identical to the corrected output audio levels. As a result, the implementation of the smoothing processing substantially starts at the second time point $2100_{s+1}$ in the sampling period.

In the case of 2, the previous smoothing-processed correction values first subject to the processing at the time point $2100_s$ in the sampling period are the level correction values when the volume levels are at the maximum value and, as shown in FIG. 4, are the smallest value of all the correction values. Therefore, the smoothing-processed correction values are increased as the time point in the sampling period 2100 chronologically transfers from $2100_s$ onward.

In the case of 3, the previous smoothing-processed correction values first subject to the processing at the time point $2100_s$ in the sampling period are the level correction values when the volume levels are at the minimum value and, as shown in FIG. 4, are the largest value of all the correction values. Therefore, the smoothing-processed correction values are decreased as the time point 2100 in the sampling period chronologically transfers from $2100_s$ onward.

For example, when the volume levels at the top of the input audio data S06 are small, to set the correction initial values at the maximum makes the audio at the top more listenable. When the volume levels at the top of the input audio data S06 are large, to set the correction initial values at the minimum or original volume levels can prevent unnecessary clipping. Thus, the correction initial values can be selectively changed in accordance with the volume levels of the input audio data S06 or the users' preferences.

In the audio processing apparatus 1000, the throughput is reduced by thinning the judgment processing implemented by the level judging unit 1100 so that the judgments can be processed without causing any problem, including the case of implementing the level corrections to the multi-channel audio data.

Further, in the audio processing apparatus 1000, a plurality of the level judging devices 1101-1103 are provided so that the channels not quite correlated with one another can be selectively level-judged by the level judging devices 1101-1103. In this manner, a variety of optional settings are available depending on the kinds of the inputted audio data, the environment where the audio data is heard or watched, the users' preferences, and the like, which enables responding to different situations and requests.

Further, a plurality of the level correcting devices 1201-1203 are provided in the audio processing apparatus 1000, a variety of the level corrections can be optionally set depending on the kinds of the inputted audio data, the environment where the audio data is heard or watched, the users' preferences, and the like, which enables responding to different situations and requests.

Further, when the decoder information is used in order to determine how often the multi-channel audio data is thinned, the level corrections can be implemented at an optimum thinning frequency depending on the forms of the audio data.

Further, the level judging devices 1101-1103 comprise the level judgment channel designating portions 1111, and the level correcting devices 1201-1203 comprise the channel processing designating portions 1220. This configuration can provide optional settings, that are, which channel is level-judged by which level judging devices 1101-1103 and also level-corrected by which level correcting devices 1201-1203 (which correction graph is used for the correction). Therefore, an optimum audio processing responding to the users' preferences and the kinds of the audio data can be implemented.

For example, taking the 5.1 ch Dolby Digital as an example, LFE (Low Frequency Effect) using right, left and front channels can be level-corrected.

Further, the level correcting devices 1201-1203 comprise the processing channel switching portions 1210 to thereby determine whether or not the level corrections with respect to the optional channels are implemented. In this manner, settings can be optionally changed depending on the kinds of the inputted audio data, the environment where the audio data is heard or watched, the users' preferences, and the like. Different situations and requests can be thereby successfully handled.

Further, the level correcting devices 1201-1203 comprise the level correction initial value switching portions 1230 so that the level correction initial values can be optionally set. The level correction initial values influence the correction level of the audio data at the initial stage. For example, some users prefer not to implement the corrections at the initial stage, while some users do prefer to implement the corrections at the initial stage to make the volume level larger because the volume level is small at the initial stage in most cases. In addition, the level correction initial values should be set at subtly different values depending on the different properties of the sound sources. Further, with the level correction initial value switching portions 1230 provided, the level correction initial values can be optionally set in accordance with the volume levels of the initial data of the input audio data and the users' preferences.

Figure 12:
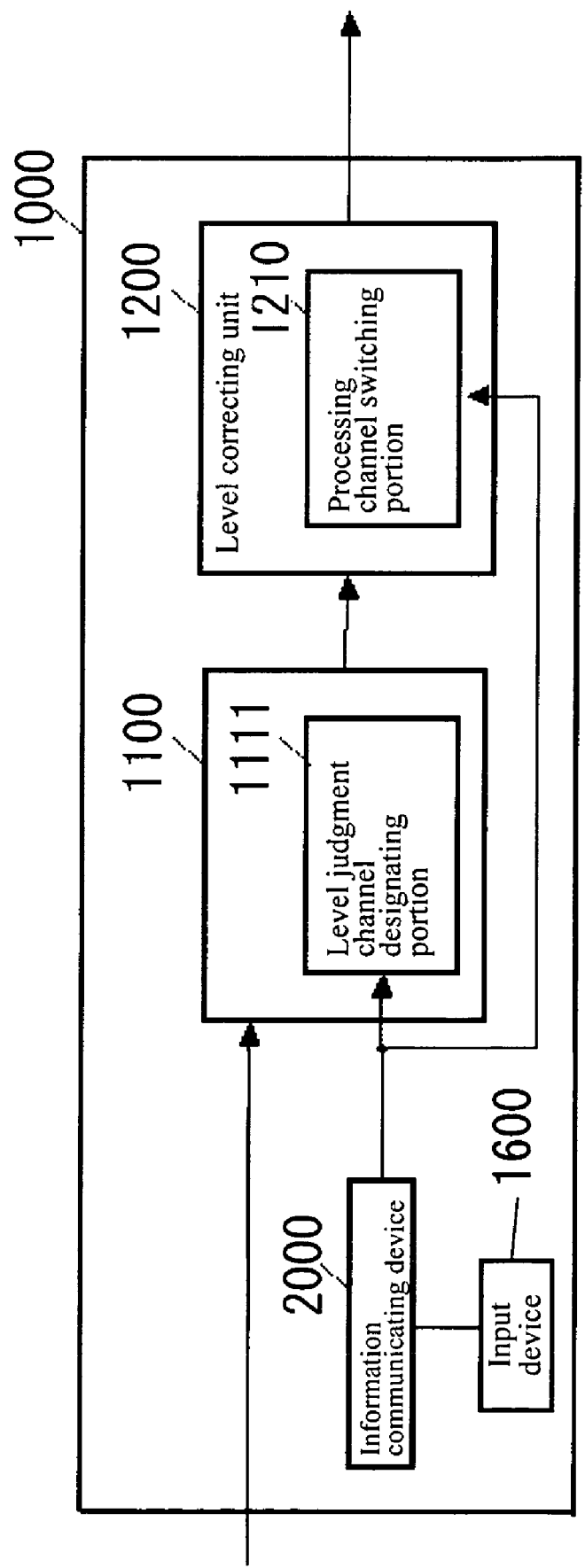
FIG. 12 is a view illustrating another configuration of a audio processing apparatus according to the Embodiment 1.

In the Embodiment 1, it is unnecessary to provide all of the level judgment channel designating portions 1111, processing channel switching portions 1210, channel processing designating portions 1220, level correction initial value switching portions 1230. For example, when the level correction initial values can be fixed, the level correction initial value switching portions 1230 are not necessary. It is unnecessary either to provide both the processing channel switching portions 1210 and channel processing designating portions 1220. FIG. 12 shows a structure not comprising the level correction initial value switching portions 1230 and channel processing designating portions 1220.

Further, it is not always necessary to provide a plurality of the level correcting devices 1201-1203 in the level correcting unit 1200. The level correcting unit 1200 can include a single level correcting device.

Figure 13:
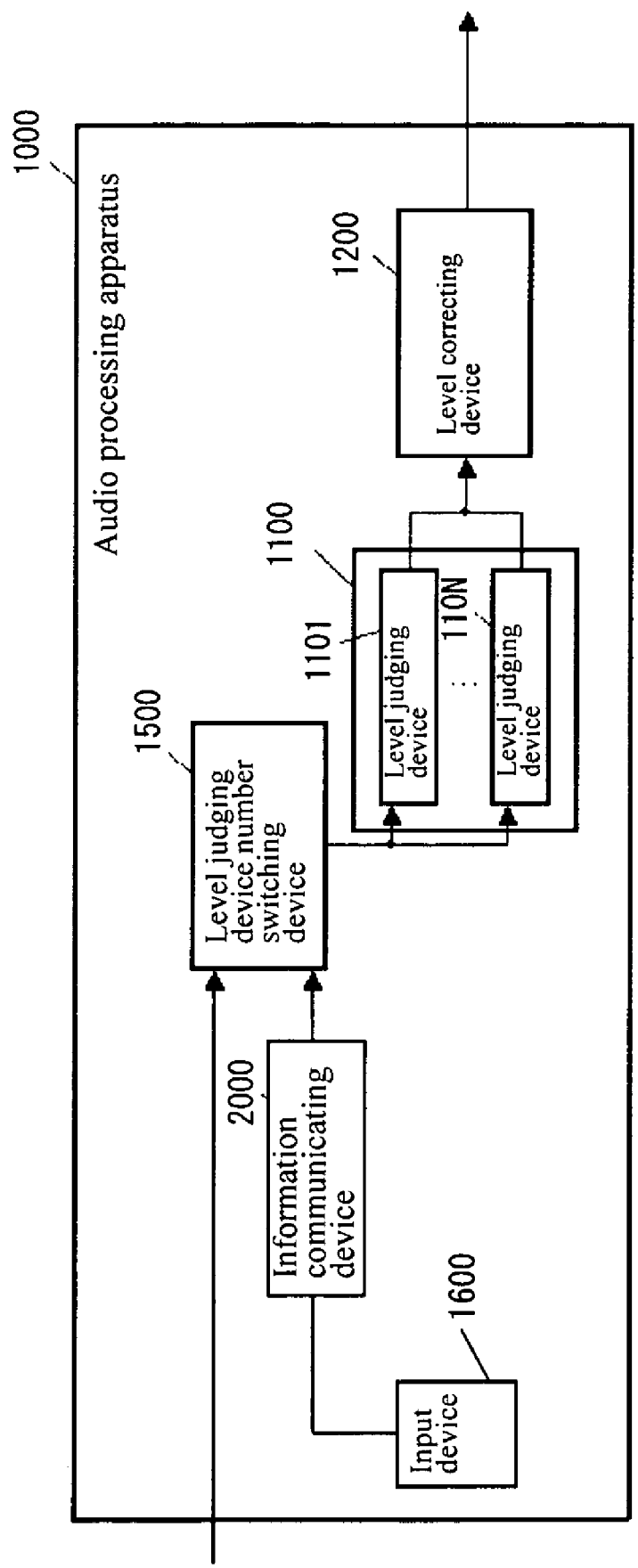
FIG. 13 is a view illustrating still another configuration of a audio processing apparatus according to the Embodiment 1.

In the case of providing a single level correcting device, the level corrections are implemented according to a kind of the correction pattern. However, it still can be judged whether or not the volume levels of the audio data are larger or smaller than the reference volume data S10 per channel. Therefore, more options are available for the audio processing compared to the conventional technology. FIG. 13 shows a structure having a single level correcting device.

Further, in the Embodiment 1, the audio data for all the channels are inputted to the respective level judging devices 1101-1103, and the channels to be level-judged are designated by the level judgment channel designating portions 1111. However, it is unnecessary to input all the channel data of the input audio data S06 to all the level judging devices 1101-1103. For example, when the audio data having six channel data is inputted, the following arrangements are possible.

A first channel data alone is exclusively supplied to the level judging device 1101.

Second to fifth channel data alone is exclusively supplied to the level judging device 1102, and the channel data subject to the level judgments is designated by the level judgment channel designating portion 1111.

All the channel data is supplied to the level judging device 1103, and the channel data subject to the level judgments is designated by the level judgment channel designating portion 1111.

In the foregoing case, the level judging device 1101 is exclusively used for the first channel data only, therefore it is unnecessary to provide the level judgment channel designating portion 1111. This configuration can be applied to the level correcting devices 1201-1203 as well.

Embodiment 2

Figure 14:
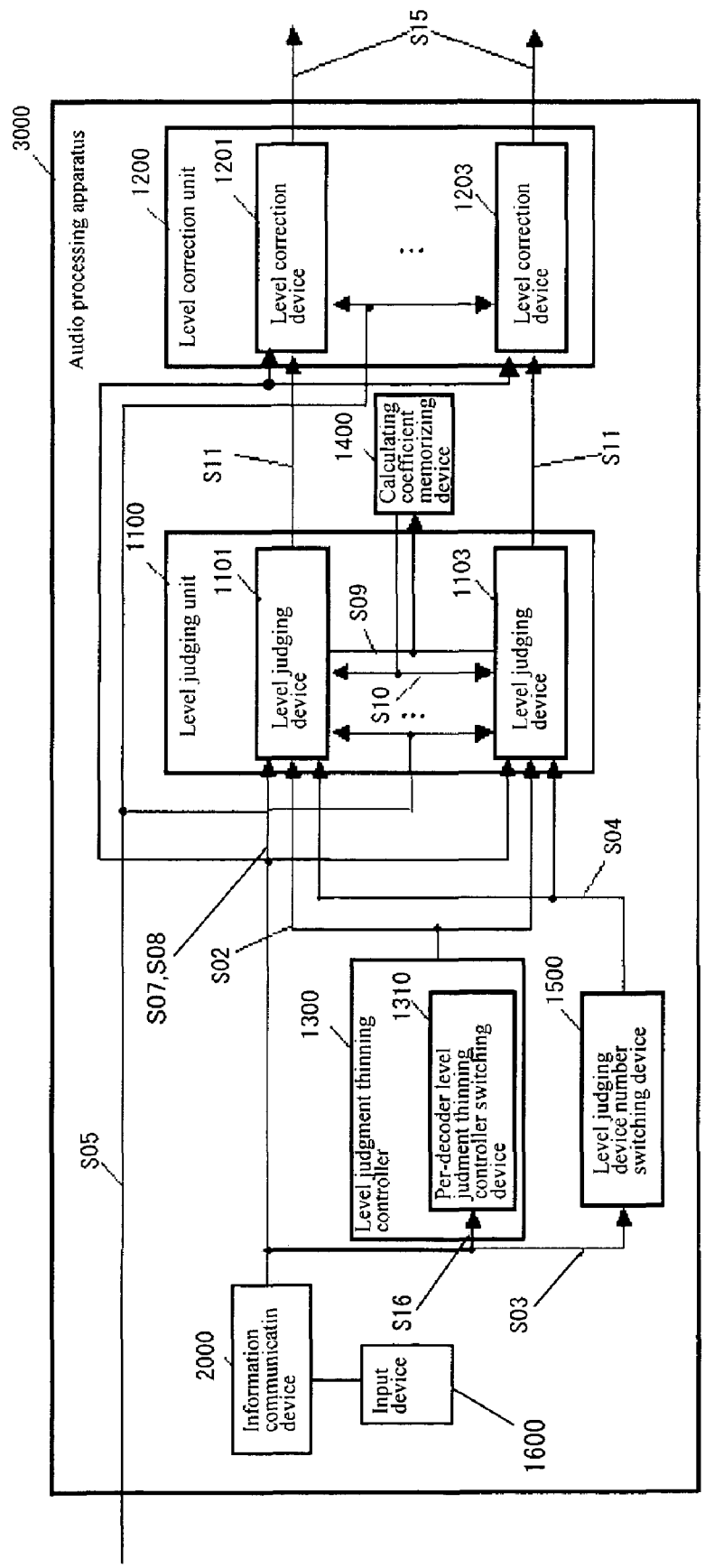
FIG. 14 is a view illustrating an example of a configuration of a audio processing apparatus according to Embodiment 2 of the present invention.

FIG. 14 a view illustrating a configuration of a audio processing apparatus 3000 according to Embodiment 2 of the present invention. The audio processing apparatus 3000 is different to the audio processing apparatus according to the Embodiment 1 in that the level judgment thinning controller 1300 comprises a per-simultaneous-implementation-function level judgment thinning controller switching device 1320, not the per-decoder level judgment thinning controller switching device 1310. The per-simultaneous-implementation-function level judgment thinning controller switching device 1320, based on simultaneous implementation function information S16 created inside the audio processing apparatus 3000 and received via the information communicating device 2000, determines intervals for implementing the level judgments by the level judging devices 1101-1103. For example, it is assumed that the audio processing apparatus 3000 comprise a function of implementing a processing 1 (virtual sound creating processing), a processing 2 (output band expansion processing), and a processing 3 (equalizer processing) simultaneously with the described level corrections according to the present invention. In such a case, as shown in FIG. 15, the per-simultaneous-implementation-function level judgment thinning controller switching device 1320 judges if there is any other processing to be implemented simultaneously with the correction processing according to the present invention and determines the intervals for implementing the level judgments by the level judging devices 1101-1103 in accordance with loads applied to the audio processing apparatus 3000 by any simultaneously-implemented processing. Taking the case shown in FIG. 15 as an example, when none of the processings 1-3 is implemented simultaneously with the corrections according to the present invention, the frequency of implementing the judgments (thinning intervals) is set at two sampling periods. On the contrary, when all of the processings 1-3 are implemented simultaneously with the corrections according to the present invention, the frequency of implementing the judgments (thinning intervals) is set at 32 sampling periods.

When a large number of the processings are simultaneously implemented, the processings are thinned more often, and when a small number of the functions are simultaneously implemented, thinning is conducted at a reduced frequency. In this manner, an overall throughput is realized at an optimum level.

Embodiment 3

Figure 16:
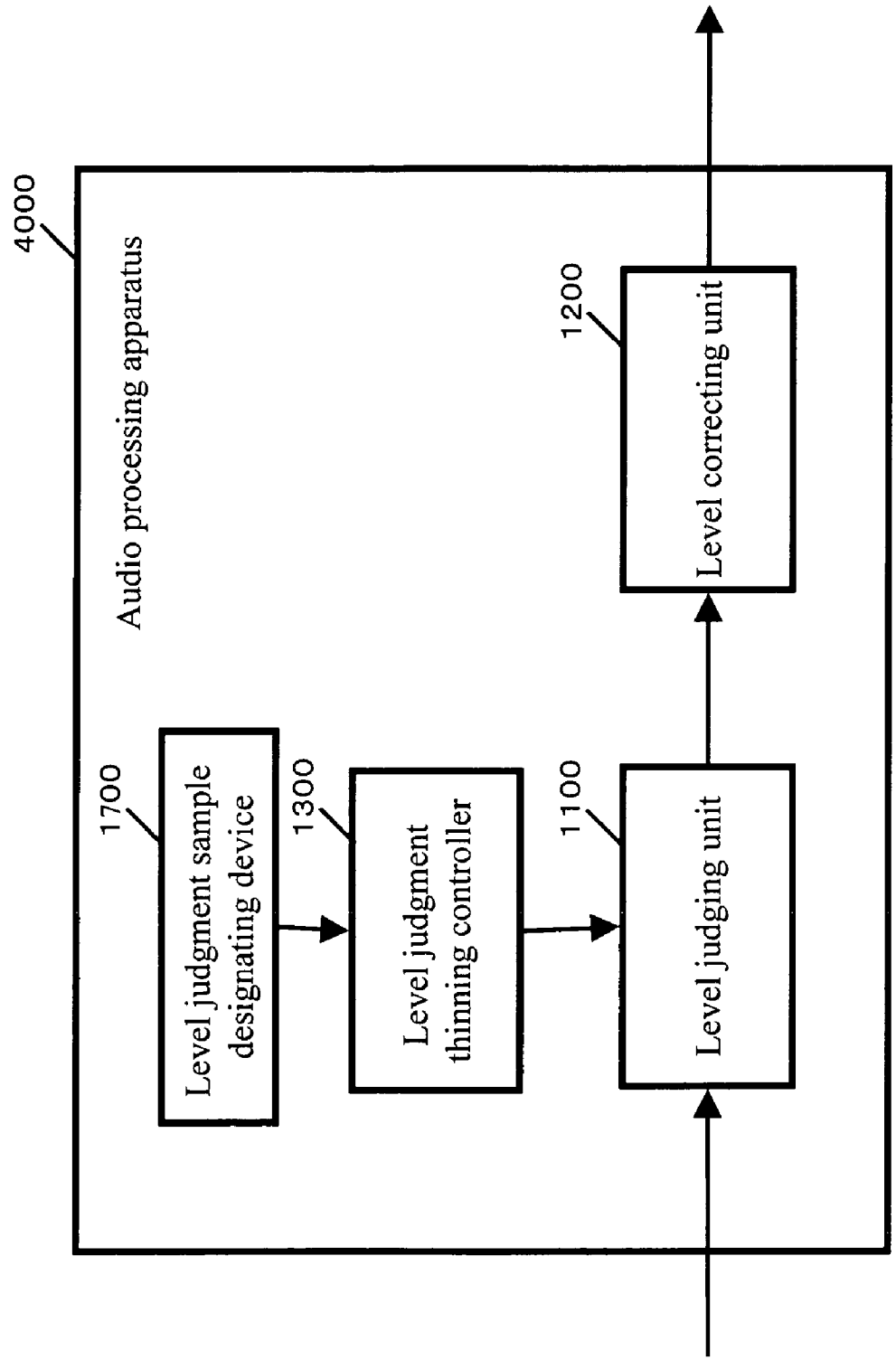
FIG. 16 is an explanatory diagram of a judgment-frequency adjustment processing according to Embodiment 3.
Figure 17:
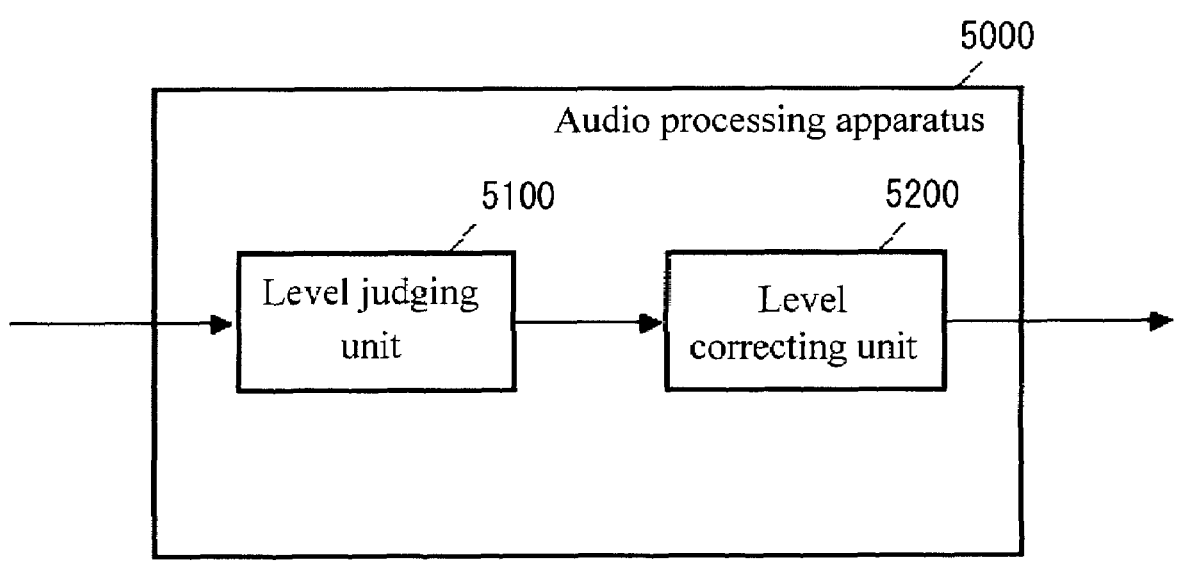
FIG. 17 is a view illustrating a configuration of a conventional audio processing apparatus.

FIG. 16 is a view illustrating a configuration of a audio processing apparatus 4000 according to Embodiment 3 of the present invention.

The audio processing apparatus 4000 further comprises a level judgment sample designating device 1700 in addition to the structures of the described audio processing apparatuses 1000 and 3000. The level judgment sample designating device 1700 generates pseudorandom numbers for designating thinning positions in the judgment thinning control implemented by the level judgment thinning controller 1300 and supplies the pseudorandom numbers to the level judgment thinning controller 1300. The level judgment thinning controller 1300, based on the pseudorandom numbers supplied by the level judgment sample designating device 1700, sets the thinning positions in the judgment thinning control, which are, in other words, allocation positions of the audio data samples subject to the judgments within a predetermined period.

In the audio processing apparatus 4000, phases of the audio data samples subject to the level judgments can be varied.

When the described thinning processing according to the present invention is implemented with respect to the samples subject to the judgments, the following judgment errors possibly occur. When the thinning processing is implemented in such manner that frequencies based on the allocation positions of the samples to be thinned(thinning frequencies) and sample frequencies of the input audio data S05 and S06 of the audio processing apparatuses 1000 and 1300 are integral multiples relative to one another, the positions of the audio data subject to the judgments are fixed in the case of the input audio data S05 and S06 being standing wave such as sinusoidal wave, thereby causing the judgments implemented by the level judging unit 1100 to generate errors.

In response to the problem, the audio processing apparatus 4000 is capable of varying the phases of the audio data samples subject to the level judgments, thereby reducing the judgment errors to the minimum.

As thus far described, the audio processing apparatus according to the present invention can reduce the throughput and implement the volume level corrections of the audio data including the multi-channel audio data, without down-mixing the multi-channel audio data into the two-channel audio data and thus maintaining the original number of the channels.

Further, methods of the level judgments, reference values, degrees of the level corrections, and the like can be changed in response to the kinds of the inputted audio data and users' preferences.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. An audio processing apparatus comprising:
a level judging unit, the level judging unit judging volume levels of input audio data that is comprised of a plurality of channel data;
a level correcting unit, the level correcting unit correcting the volume levels based on the judgment results of the level judging unit; and
a level judgment thinning controller, the level judgment thinning controller adjusting a frequency of implementing level judgments by the level judging unit, wherein
the level judgment thinning controller changes said frequency based on the number of channels of the input audio data that is comprised of a plurality of channel data.

2. An audio processing apparatus as claimed in claim 1, wherein
the level judging unit has a plurality of level judging devices, the plurality of level judging devices implementing the level judgments of at least one of the channel data.

3. An audio processing apparatus as claimed in claim 1, wherein
the level judging unit judges the audio levels in synchronization with a sampling period as a basic processing of the audio processing apparatus, and
the level judgment thinning controller periodically thins optional time points in the sampling period from all the time points therein and judges the audio levels at remaining time points.

4. An audio processing apparatus as claimed in claim 2, wherein
the level correcting unit has a plurality of level correcting devices each corresponding to the respective plurality of level judging devices.

5. An audio processing apparatus as claimed in claim 2, wherein
the level judging devices comprise level judgment channel designating portions, the level judgment channel designating portions determining the channel data subject to the level judgments out of the plurality of channel data.

6. An audio processing apparatus as claimed in claim 4, wherein
the plurality of channel data is inputted to at least one of the level correcting devices, and
the level correcting devices comprise channel processing designating portions, the channel processing designating portions determining the channel data to be level-corrected out of the inputted plurality of channel data.

7. An audio processing apparatus as claimed in claim 4, wherein
the plurality of channel data of the input audio data is inputted to at least one of the level correcting devices, and
the level correcting devices comprise processing channel switching portions, the processing channel switching portions determining whether or not the level corrections are implemented to the respective inputted plurality of channel data.

8. An audio processing apparatus as claimed in claim 4, wherein
at least one of the level correcting devices comprises a level correction initial value switching portion, the level correction initial value switching portion changing correction initial values at the time of commencing the level corrections.

9. An audio processing apparatus as claimed in claim 1, wherein
the level correcting unit divides the input audio level into a plurality of audio level regions according to the levels thereof and sets a correction pattern for each of the divided audio level regions to thereby correct the volume levels, and
the level judging unit calculates a borderline between the adjacent audio level regions as an intersecting point between a first linear expression showing the correction pattern set on one side of the adjacent audio level regions ($Y=a_1X+b_1$) and a second linear expression ($Y=a_2X+b_2$) showing the correction pattern set on another side of the adjacent audio level regions, wherein:
X, represents the input audio data of the audio processing apparatus,
Y, represents the output audio data of the audio processing apparatus,
$a_1$, represents an amplification coefficient of input audio data X, and corresponds to a correction pattern of the first linear expression,
$a_2$, represents an amplification coefficient of input audio data X, and corresponds to a correction pattern of the second linear expression,
$b_1$, represents a level correction parameter subject to optional change, and corresponds to a correction pattern of the first linear expression, and
$b_2$, represents a level correction parameter subject to optional change, and corresponds to a correction pattern of the second linear expression.

10. An audio processing apparatus as claimed in claim 9, further comprising:
an input device to which a first level correction parameter for implementing a fine adjustment to the value $b_1$ of the first linear expression and a second level correction parameter for implementing a fine adjustment to the value $b_2$ of the second linear expression are inputted by a user of the audio processing apparatus; and a calculating coefficient memorizing device, the calculating coefficient memorizing device storing substantive value data of the borderline values, wherein the level judging unit has a table, the table specifying the border line data based on a correlation between the first and second level correction parameters, and the level judging unit specifies the borderline values specifying data by referring the first and second level correction parameters inputted to the input device to the table and the level judging unit further reads out the substantive value data of the borderline values from the calculating coefficient memorizing device based on the specified borderline specifying data to thereby specify the audio level regions of the input audio data based on the read-out substantive value data of the borderline.

11. An audio processing apparatus as claimed in claim 3, wherein the level judgment thinning controller optionally sets the remaining time points in the sampling period, at which the audio levels are judged, based on pseudorandom numbers.

12. An audio processing apparatus comprising:

a level judging unit, the level judging unit judging volume levels of input audio data;

a level correcting unit, the level correcting unit correcting the volume levels based on the judgment results of the level judging unit; and a level judgment thinning controller, the level judgment thinning controller adjusting a frequency of implementing the level judgments by the level judging unit, wherein the level judgment thinning controller changes said frequency responsive to loads applied to the audio processing apparatus by any processing implemented by the audio processing apparatus to the input audio data, said any processing being other than the level correction processing that simultaneously implemented by the level correcting unit.

13. An audio processing apparatus as claimed in claim 12, wherein the audio data is comprised of a plurality of channel data, and the level judging unit has a plurality of level judging devices, the plurality of level judging devices implementing the level judgments of at least one of the channel data.

14. An audio processing apparatus as claimed in claim 12, wherein the level judging unit judges the audio levels in synchronization with a sampling period as a basic processing of the audio processing apparatus, and the level judgment thinning controller periodically thins optional time points in the sampling period from all the time points therein and judges the audio levels at remaining time points.

15. An audio processing apparatus as claimed in claim 13, wherein the level correcting unit has a plurality of level correcting devices and correspond to the plurality of level judging devices one-to-one.

16. An audio processing apparatus as claimed in claim 13, wherein the level judging devices comprise level judgment channel designating portions, the level judgment channel designating portions determining the channel data subject to the level judgments out of the plurality of channel data.

17. An audio processing apparatus as claimed in claim 16, wherein the plurality of channel data is inputted to at least one of the level correcting devices, and the level correcting devices comprise channel processing designating portions, the channel processing designating portions determining the channel data to be level-corrected out of the inputted plurality of channel data.

18. An audio processing apparatus as claimed in claim 16, wherein the plurality of channel data of the input audio data is inputted to at least one of the level correcting devices, and the level correcting devices comprise processing channel switching portions, the processing channel switching portions determining whether or not the level corrections are implemented to the respective inputted plurality of channel data.

19. An audio processing apparatus as claimed in claim 16, wherein at least one of the level correcting devices comprises a level correction initial value switching portion, the level correction initial value switching portion changing correction initial values at the time of commencing the level corrections.

20. An audio processing apparatus as claimed in claim 12, wherein the level correcting unit divides the input audio level into a plurality of audio level regions according to the levels thereof and sets a correction pattern for each of the divided audio level regions to thereby correct the volume levels, and the level judging unit calculates a borderline between the adjacent audio level regions as an intersecting point between a first linear expression showing the correction pattern set on one side of the adjacent audio level regions ($Y=a_1X+b_1$) and a second linear expression ($Y=a_2X+b_2$) showing the correction pattern set on another side of the adjacent audio level regions, wherein:

X, represents the input audio data of the audio processing apparatus,

Y, represents the output audio data of the audio processing apparatus, $a_1$, represents an amplification coefficient of input audio data X, and corresponds to a correction pattern of the first linear expression, $a_2$, represents an amplification coefficient of input audio data X, and corresponds to a correction pattern of the second linear expression, $b_1$, represents a level correction parameter subject to optional change, and corresponds to a correction pattern of the first linear expression, and $b_2$, represents a level correction parameter subject to optional change, and corresponds to a correction pattern of the second linear expression.

21. An audio processing apparatus as claimed in claim 20, further comprising:

an input device to which a first level correction parameter for implementing a fine adjustment to the value $b_1$ of the first linear expression and a second level correction parameter for implementing a fine adjustment to the value $b_2$ of the second linear expression are inputted by a user of the audio processing apparatus; and a calculating coefficient memorizing device, the calculating coefficient memorizing device storing substantive value data of the borderline values, wherein the level judging unit has a table, the table specifying the border line data based on a correlation between the first and second level correction parameters, and the level judging unit specifies the borderline values specifying data by referring the first and second level correction parameters inputted to the input device to the table and the level judging unit further reads out the substantive value data of the borderline values from the calculating coefficient memorizing device based on the specified borderline specifying data to thereby specify the audio level regions of the input audio data based on the read-out substantive value data of the borderline.

22. An audio processing apparatus as claimed in claim 14, wherein the level judgment thinning controller optionally sets the remaining time points in the sampling period, at which the audio levels are judged, based on pseudorandom numbers.

* * * * *

UNITED STATES PATENT AND TRADEMARK OFFICE
CERTIFICATE OF CORRECTION

PATENT NO. : 7,613,312 B2
APPLICATION NO. : 10/851181
DATED : November 3, 2009
INVENTOR(S) : Sakakibara et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1317 days.

Signed and Sealed this

Nineteenth Day of October, 2010

David J. Kappos
*Director of the United States Patent and Trademark Office*